(12) United States Patent
Kim et al.

(10) Patent No.: US 9,379,137 B2
(45) Date of Patent: Jun. 28, 2016

(54) ARRAY SUBSTRATE FOR DISPLAY PANEL AND METHOD FOR MANUFACTURING THEREOF

(71) Applicant: LG Display Co., Ltd., Seoul (KR)

(72) Inventors: Sooho Kim, Gyeongsangbuk-do (KR); TaeYoun Ko, Gumi-si (KR); Hyunjik Bae, Daegu (KR); Intae Ko, Daegu (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/526,956

(22) Filed: Oct. 29, 2014

(65) Prior Publication Data

US 2015/0123136 A1    May 7, 2015

(30) Foreign Application Priority Data

Nov. 7, 2013    (KR) .................. 10-2013-0134984

(51) Int. Cl.
| | |
|---|---|
| *G02F 1/1345* | (2006.01) |
| *G02F 1/1362* | (2006.01) |
| *H01L 27/12* | (2006.01) |
| *G09G 3/36* | (2006.01) |

(52) U.S. Cl.
CPC ........ *H01L 27/1222* (2013.01); *G02F 1/13454* (2013.01); *G02F 1/136204* (2013.01); *G09G 3/3677* (2013.01); *H01L 27/124* (2013.01); *H01L 27/1259* (2013.01); *G09G 2300/0408* (2013.01); *G09G 2300/0426* (2013.01); *G09G 2330/04* (2013.01)

(58) Field of Classification Search
CPC .............. G02F 1/1345; G02F 1/13454; G02F 1/136204; G09G 2300/0408
See application file for complete search history.

(56) References Cited

U.S. PATENT DOCUMENTS

| | | | |
|---|---|---|---|
| 2002/0068388 A1* | 6/2002 | Murakami et al. ............ 438/149 |
| 2004/0150771 A1* | 8/2004 | Lee ........................ G02F 1/1339 349/114 |
| 2007/0197019 A1* | 8/2007 | Kang et al. .................... 438/620 |
| 2008/0117558 A1* | 5/2008 | Shih .................. G02F 1/136204 361/117 |
| 2011/0316831 A1* | 12/2011 | Ochiai ................. G09G 3/3677 345/208 |
| 2012/0146889 A1* | 6/2012 | Kwak ............... G02F 1/134363 345/88 |
| 2013/0250201 A1 | 9/2013 | Kobashi |
| 2013/0270582 A1* | 10/2013 | Shin et al. ...................... 257/88 |

FOREIGN PATENT DOCUMENTS

EP    1 213 763 A2    6/2002

* cited by examiner

*Primary Examiner* — Jessica M Merlin
(74) *Attorney, Agent, or Firm* — Fenwick & West LLP

(57) ABSTRACT

Disclosed are an array substrate and a method of fabricating the same. The array substrate includes an active area including a plurality of pixels defined at an intersection area of a gate line and a data line, a gate driving circuit formed at one side of a non-active area and a signal line extending in parallel with the data line in the non-active area to transfer a signal to the gate driving circuit. The signal line includes a first line with a plurality of segmental lines, and at least one additional line formed of a different material and formed at a different layer than the first line. The at least one additional line electrically connects two segmental lines of the first line adjacent to each other.

11 Claims, 19 Drawing Sheets

ARRAY SUBSTRATE FOR DISPLAY PANEL AND METHOD FOR MANUFACTURING THEREOF

CROSS-REFERENCE TO RELATED APPLICATION

This application claims priority from Korean Patent Application No. 10-2013-0134984, filed on Nov. 7, 2013, which is hereby incorporated by reference for all purposes as if fully set forth herein.

BACKGROUND OF THE INVENTION

1. Field of the Invention

The present disclosure relates to an array substrate for a display panel and a method for manufacturing thereof. More specifically, the present disclosure relates to a structure and a method capable of preventing a damage of a substrate due to static electricity in a display panel with a gate-in-panel (GIP) structure.

2. Description of the Prior Art

As information oriented society has been developed, demands for displays for displaying an image are increasing. Thus, various flat displays such as a liquid crystal display (LCD), a plasma display panel (PDP), and organic light, emitting display (OLED) have been used recently.

Active matrix type liquid crystal displays among the liquid crystal display including an array substrate including a thin film transistor (TFT) as a switching device for controlling an on/off state of voltage for each pixel have been generally used.

Such active matrix type liquid crystal display includes a liquid crystal panel including the array substrate including a thin film transistor (TFT) as a switching device for controlling an on/off state of voltage for each pixel and a color filter substrate including a color filter, and a liquid crystal layer interposed between the array substrate and the color filter substrate. The liquid crystal display further implements a driver having a driving circuit to drive the liquid crystal panel.

The driver is generally embodied on a driving printed-circuit-board (PCB). The driving PCB can be divided into a gate driving PCB connected to gate lines on the liquid crystal panel, and a data driving PCB connected to data lines of the liquid crystal panel.

Also, the gate driving PCB is connected to a gate pad portion (i) formed in an edge of the liquid crystal panel and (ii) connected to the gate lines. The data driving PCB is connected to a data pad portion (i) formed in another edge of the liquid crystal panel perpendicular to the edge with the gate pad portion and (ii) connected to the data lines. Such gate and data driving PCBs are mounted on the liquid crystal panel by using, for example, a tape carrier package (TCP) or a Flexible Printed Circuit (FPC).

However, the driving PCB, which is divided into the gate and data driving PCBs and loaded on the gate and data pad portions, causes the size and weight of the liquid crystal display to increase.

To address this matter, the liquid crystal display with a gate-in-panel (GIP) structure has been proposed which allows only one driving PCB to be loaded on one edge of the liquid crystal panel with the gate driving circuit directly formed on the liquid crystal panel.

FIG. 1 is a circuitry diagram schematically showing an array substrate included in a liquid crystal display with a GIP structure according to the related art.

As shown in FIG. 1, the array substrate of the liquid crystal display with the GIP structure is divided into an active area AA used to display images and a non-active area NA configured to surround the active area AA.

The active area AA includes gate line GL and data line DL configured to cross each other and to define pixel regions P, thin film transistors TR, each connected to the respective gate line GL and data line DL, and pixel electrodes PXL connected to the respective thin film transistors TR.

On the other hand, a part of the non-active area adjacent to a top edge of the active area AA includes a plurality of circuit films (not shown) divisionally loaded with a data driver (not shown). Another part of the non-active area adjacent to one of both side edges of the active area AA includes a gate driving circuit GCA and a signal input portion SIA positioned adjacent to an edge of the gate driving circuit GCA.

The gate driving circuit GCA is configured with a plurality of circuit blocks CB1 and CB2, and each of the plurality of circuit blocks CB1 and CB2 includes a plurality of switching elements, capacitors, and so on. One circuit block CB1 of the circuit blocks is connected to the gate lines formed in the active area AA and many kinds of signal lines CL1 to CL4 formed in the signal input portion SIA.

In this specification, a line extending from the data driving circuit or driver over the entire panel in parallel with the data lines and transferring various signals to the gate driving circuit GCA may be referred to as a signal input area (SIA). The line(s) included in the signal input area SIA may be referred to as a signal line(s).

A connecting line to connect between the signal line included in such signal input area SIA and the circuit block of the gate driving circuit GCA may be generally referred to as a gate link line (GLL).

The signal line included in such signal input area SIA may be a metal line patterned by the gate metal layer extending from the data driving circuit or driver to a top of the panel, namely over the entire panel. Meanwhile, static electricity may be generated in manufacturing the signal lines of a gate metal pattern due to friction or contacts between the manufacturing device and the panel and the like, and a large amount electric charge may be kept or charged at the gate metal pattern of such signal lines. During the next processes for forming the source/drain metal layer and so on, the electrical charge maintained at the signal line pattern may be transferred over to the source/drain metal layer.

As a result, the static electricity generated in manufacturing process of patterning the signal lines and gate metal layer may destroy an insulating layer such as a gate insulating layer between the gate metal layer and source/drain metal layer so that a gate metal layer and a source/drain metal layer may be short-circuited.

That is, during manufacturing the display panel with the GIP structure, specific signal line of the GIP is formed of a metal such as the gate metal pattern and longitudinally extends over the entire panel so that the quantity of the electric charge stored on such signal line may become too large. Therefore, the static electricity generated in manufacturing process of the signal line may damage a part of the display panel during the following manufacturing processes.

SUMMARY OF THE INVENTION

The present invention has been made to solve the above-mentioned problems in the conventional art, and an aspect of the present invention is to provide a display panel and a display device with a GIP structure that is adapted to prevent the generation of static electricity, and a manufacturing method thereof.

Another object of the present disclosure is to provide a display panel and a display device with a GIP structure that is adapted to prevent the generation of static electricity on an electrical line such as a signal line and the like elongated from an active area of a display device with a GIP structure, and a manufacturing method thereof.

In accordance with an aspect of the present invention, an array substrate is provided. The array substrate includes: an active area including a plurality of pixels defined at an intersection area of a gate line and a data line, a gate driving circuit formed at one side of a non-active area and a signal line extending in parallel with the data line in the non-active area to transfer a signal to the gate driving circuit, the signal line including a first line with a plurality of segmental lines, and at least one additional line formed of different material and formed at a different layer than the first line, the at least one additional line electrically connecting two segmental lines of the first line adjacent to each other.

In one or more embodiments, the at least one additional line comprises a second line, wherein the first line is formed of a gate metal and the second line is formed of a source/drain metal, and the second line is connected with the first line via a contact hole formed through a gate insulating layer.

In one or more embodiments, the at least one additional line comprises a second line wherein the first line is formed of a gate metal and the second line is formed of a pixel electrode material, and the second line is connected with the first line via a contact hole formed through a gate insulating layer and a passivation layer.

In one or more embodiments, the at least one additional line comprises a third line formed of a different layer than the first line and partially overlapped with two segmental lines of the first line adjacent to each other, and a fourth line electrically connecting the two segmental lines of the first line to the third line.

In one or more embodiments, the first line is formed of a gate metal and the third line is formed of a source/drain metal, the fourth line is formed of a pixel electrode material, the fourth line is connected to both the first line and the third line via a contact hole formed through a gate insulating layer and passivation layer to expose a part of the first line and an additional contact hole formed through the passivation layer to expose a part of the third line.

In one or more embodiments, the signal line is a forward start signal line or a backward start signal line supplying a start pulse to the gate driving circuit and disposed between the gate driving circuit and the active area.

In accordance with another aspect of the present invention, an array substrate is provided. The array substrate includes: an active area including a plurality of pixels defined at an intersection area of a gate line and a data line, a gate driving circuit formed at one side of a non-active area and a signal line extending in parallel with the data line in the non-active area to transfer a signal to the gate driving circuit, wherein the signal line comprises a first line with a plurality of segmental lines and a first additional line formed of a different layer than the first line and partially overlapped with two segmental lines of the first line adjacent to each other, and a second additional line electrically connecting the two segmental lines of the first line to the first additional line.

In accordance with another aspect of the present invention, a method of fabricating an array substrate is provided. The method includes: forming a first line with a plurality of segmental lines as a part of a signal line in a non-active area by patterning a first metal layer on a substrate, forming one or more insulating layers on the substrate on which a gate is patterned, forming at least one contact hole through the one or more insulating layers to expose a part of the first line and forming at least one additional line by patterning a second metal layer different from the first metal layer to electrically connect two segmental lines of the first line adjacent to each other.

In one or more embodiments, the first metal layer is a gate metal layer, the one or more insulating layers include a gate insulating layer and the second metal layer is a source/drain metal layer.

In one or more embodiments, the first metal layer is a gate metal layer, the one or more insulating layers include a gate insulating layer and a passivation layer, and the second metal layer is a pixel electrode layer.

In one or more embodiments, the first metal layer is a gate metal layer, the one or more insulating layers include a gate insulating layer and at least one passivation layer, wherein forming the one or more insulation layers, the at least one contact hole and the at least one additional line includes: forming (i) the gate insulating layer on the substrate on which the gate is patterned, and (ii) a third line with a source/drain metal, wherein ends of the third line are partially overlapped with the two segmental lines of the first line adjacent to each other; forming (i) the passivation layer on the non-active area, (ii) a contact hole penetrating the gate insulating layer and the passivation layer to expose a part of the first line, and (iii) an additional contact hole penetrating the passivation layer to expose a part of the third line; and forming a fourth line electrically connecting the two segmental lines adjacent to each other to the third line through (i) the contact hole penetrating the gate insulating layer and the passivation layer, and (ii) the additional contact hole penetrating the passivation layer during a pixel electrode patterning process.

In one or more embodiments, the signal line is a forward start signal line or a backward start signal line supplying a start pulse to the gate driving circuit and disposed between the gate driving circuit and an active area.

In accordance with still another aspect of the present invention, a method of fabricating an array substrate is provided. The method includes forming a first line with a plurality of segmental lines as a part of a signal line in a non-active area by patterning a first metal layer on a substrate, forming one or more insulating layers on the substrate on which a gate is patterned, and a first additional line with a source/drain metal, wherein ends of the first additional line are partially overlapped with two segmental lines of the first line adjacent to each other, forming a passivation layer on the non-active area, a contact hole penetrating the gate insulating layer and the passivation layer to expose a part of the first line and an additional contact hole penetrating the passivation layer to expose a part of the first additional line and forming a second additional line electrically connecting the two segmental lines adjacent to each other to the first additional line through the contact hole penetrating the gate insulating layer and the passivation layer and the additional contact hole penetrating the passivation layer.

As mentioned above, various embodiments may prevent the generation of static electricity in a display device with a GIP structure.

As mentioned above, various embodiments may prevent the generation of static electricity from the elongated signal line during manufacturing the display panel with the GIP structure, thereby preventing destroying the gate metal and the like.

DETAILED DESCRIPTION OF THE EXEMPLARY EMBODIMENT

Figure 1:
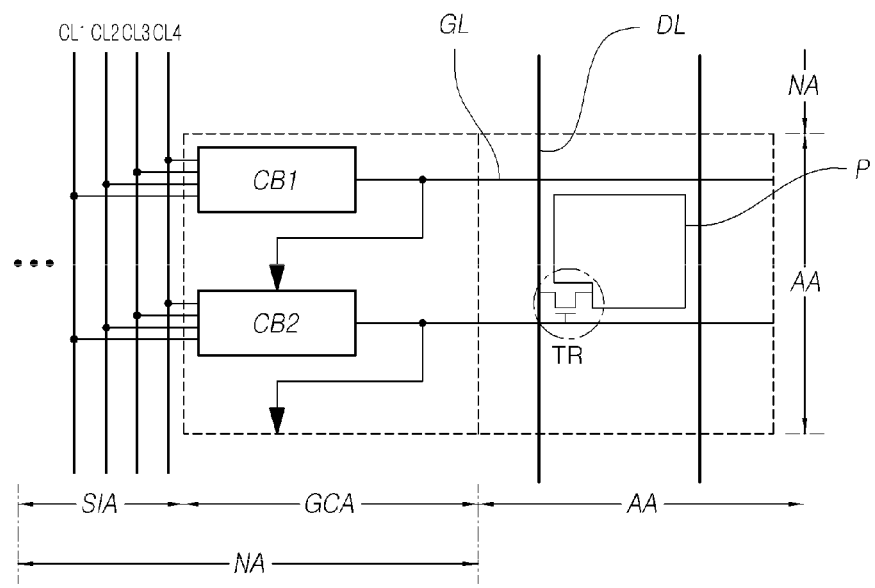
FIG. 1 is a circuitry diagram schematically showing an array substrate included in a liquid crystal display with a GIP structure according to the related art.

Hereinafter, a few embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may not be required for the understanding of the subject matter of the present invention.

In addition, terms, such as first, second, A, B, (a), (b) or the like may be used herein when describing components of the present invention. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component. Likewise, when it is described, that a certain element is formed "on" or "under" another element, it should be understood that the certain element may be formed either directly or indirectly via still another element on or under the other element. Furthermore, it should be understood that, unless otherwise indicated, elements, features or components described herein below in connection with one of the embodiments may not be limited to this embodiment but may also be applied in the other embodiments to form new embodiments.

Various embodiments will be described, below with reference to the accompanying drawings.

Figure 2:
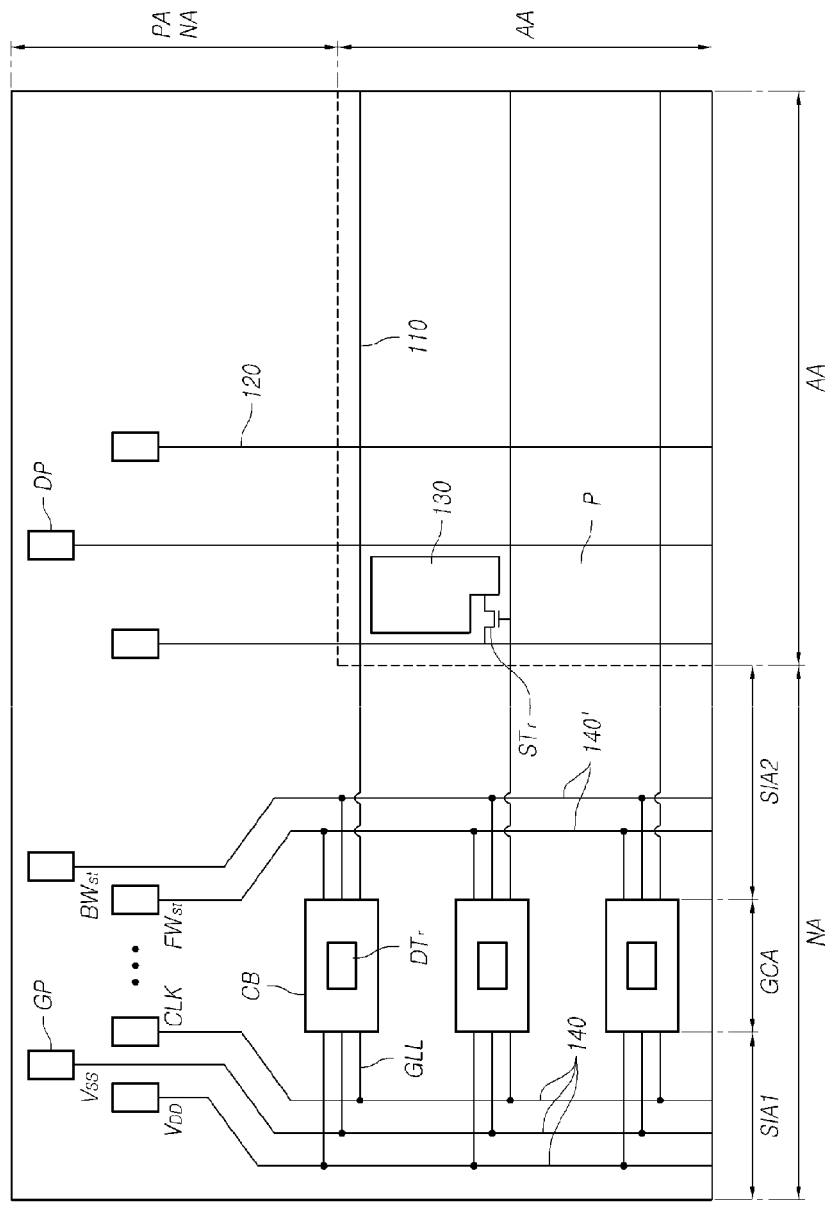
FIG. 2 is a block diagram schematically showing an array substrate included in an LCD device with a GIP structure according to various embodiments of the present disclosure.

FIG. 2 is a block diagram schematically showing an array substrate included in an LCD device with a GIP structure according to various embodiments of the present disclosure.

As shown in FIG. 2, the array substrate of the LCD device with the GIP structure according to various embodiments of the present disclosure is divided into an active area AA used to display images and a non-active area NA configured to surround the active area AA. A top edge of the non-active area NA includes a pad part PA. A side edge of the non-active area NA includes a gate driving circuit GCA and a signal input portions SIA1 and SIA2. In one aspect, the signal input portion SIA1 is positioned on a side edge of the gate driving circuit GCA, and the signal input, portion SIA2 is positioned on the other side edge of the gate driving circuit GCA facing away from the side edge.

The active area AA includes gate line 110 and data line 120 configured to cross each other and to define pixel regions P, thin film transistors STr each connected to the respective gate line 110 and data line 120, and pixel electrodes 130 connected to the respective thin film transistors STr. The thin film transistors STr are used as switching elements.

Also, the pad part PA on the non-active area NA adjacent to a top edge of the active area AA includes a data pad portion DP, which is connected to the data lines 120 formed in the active area AA to connect an external driving printed circuit board (not shown), and a gate pad portion GP, which consists of the farthest end of a plurality of signal lines 140 and 140' formed in the signal input portions SIA1 and SIA2.

The gate driving circuit. GCA is configured with a plurality of circuit blocks CB each including a plurality of driving transistors DTr, capacitors, and so on. Each of the circuit blocks CB is connected to the gate lines 110 formed on the active area AA and a plurality of gate link lines GLL extended from signal lines 140 and 140' of the signal input portion SIA1 and SIA2.

The signal lines 140 and 140' defined in one embodiment may be metal lines elongated from the data pad portion DP connected to the data driving circuit to a top portion of the display panel, and supply many kinds of signals to the circuit, blocks CB of the gate driving circuit GCA.

Such signal lines 140 and 140' may include a line VDD for supplying a high level driving voltage, a line VSS for supplying low level driving voltage, a line CLK for supplying a clock signal and a line for supplying a start pulse (VST).

Such signal lines may be generally formed by linearly extending over the entire length of the panel, for example the entire length of the panel in FIG. 2, with the Same material and the same process as the gate metal layer.

After a gate insulating layer is formed on the gate metal layer, a semiconductor layer (active layer), a source/drain metal layer and a pixel layer are sequentially formed in order to form a driving thin film transistor DTr in the non-active area and a switching thin film transistor STr in the active area. A plurality of patterning processes such as a deposition, a lithography and an etching process may be performed in order to form each layer, and static electricity may be generated from an equipment used for these processes.

As mentioned above, the linear signal line extended over the entire length of the panel is long and includes a large sectional-area, and thereby has a large quantity of electric charge. Therefore, the static electricity generated from the patterning process flows through the signal line with the large quantity of electric charge so that it can frequently induce either the damage of the gate insulating layer and the like or the additional damage of other metal patterns such as the source/drain metal layer by conducting over the gate insulating layer.

As shown in FIG. 2, while the signal lines 140 such as the VDD line, the VSS line, the CLK line and the like may be disposed in the signal line area SIA1 on the outer side of the gate driving circuit GCA, namely the signal line area farther than the gate driving circuit from the active area, the signal lines 140' supplying the start signal or start pulse may be disposed in the signal line area SIA2 on the inner side of the gate driving circuit GCA, namely the signal line area between the gate driving circuit GCA and the active area AA.

When the static electricity is generated during the patterning process of the thin film transistor in the active area or the gate driving circuit area, a larger amount of static electricity is conducted to the signal lines 140 disposed between the gate driving circuit GCA and the active area AA so that it may be more likely that damage is caused to a part of the gate driving circuit GCA and the active area AA adjacent to the signal lines 140' than to a part that is adjacent to other signal lines, for example signal lines 140 disposed at the outer side of the gate driving circuit GCA.

The signal lines 140' for supplying a at art pulse may include a forward start signal line FWst and a backward start signal line BWst for bi-directional driving or scanning. The present specification collectively refers to a forward start signal line FWst and a backward start signal line BWst as a start signal line.

Figure 3:
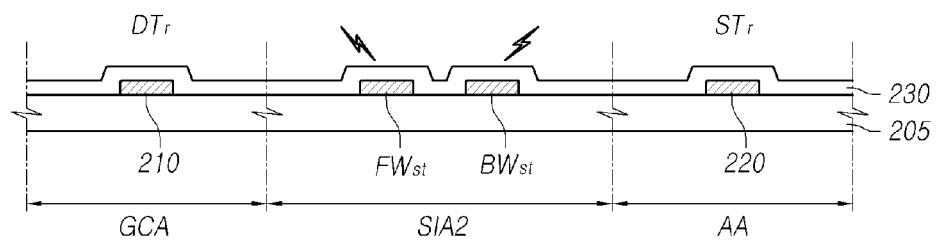
FIG. 3 illustrates the generation of static electricity in a display panel to which various embodiments may be applied.

FIG. 3 illustrates the generation of static electricity in a display panel to which various embodiments may be applied.

As shown in FIG. 3, the gate metal layer is patterned on a transparent insulation substrate 205 such as a glass substrate. During this process, the start signal lines FWst, BWst in the signal line area SIA2 are formed on the entire panel in the longitudinal direction of the panel, namely the direction to which the data line is extended.

Subsequently, the patterning process for the thin film transistor STr in the active area AA or the thin film transistor DTr in the gate driving circuit area GCA is performed, and during this patterning process, the large static electricity may be conducted to the start signal lines FWst and BWst having large quantity of electric charge so that it can be more likely that damage is caused to a plurality of layers or elements of the display panel such as the gate insulation layer and so on. In FIG. 3, 210 and 220 are the gate electrodes of the driving transistor DTr and the switching thin film transistor STr respectively, and 230 is an insulation layer.

To address this matter, in accordance with various embodiments an array substrate for the display panel is proposed which includes an active area including a plurality of pixels defined at an intersection area of a gate line and a data line, a gate driving circuit formed at one side of a non-active area and a signal line extending in parallel with the data line in the non-active area to transfer a signal to the gate driving circuit. The signal line may include a first line with a plurality of segmental lines, and at least one second line, as a connecting line, formed of a different material and formed at a different layer than the first line. The second line may electrically connect two segmental lines of the first line adjacent to each other.

That is, one of the signal lines to which the static electricity may be largely charged is segmented into a plurality of segmental lines, e.g. gate metal lines, namely the first line with a plurality of segmental lines, and the segmental lines are connected to each other by the connecting line at the different layer therefrom as a jumper, thereby preventing the damage from the charged static electricity generated in various patterning processes after the gate patterning.

In an array substrate according to the first embodiment referring to FIGS. 4, 5 and 6A through 6C, among three embodiments described in the present specification the first line formed as a plurality of segmental lines may be formed of a gate metal and the second line may be formed of a source/drain metal, and the second line may be connected to the first line via a first contact hole formed through a gate insulating layer.

In an array substrate according to the second embodiment referring to FIGS. 7 and 8A through 8D, the first line may be formed of a gate metal and the second line may be formed of a pixel electrode material, and the second line may be connected to the first line via a second contact hole formed through a gate insulating layer and a passivation layer.

In an array substrate according to the third embodiment referring to FIGS. 9 and 10A through 10D, the second line may include a third line formed of the different layer from the first line and partially overlapped with two segmental lines of the first line adjacent to each other, and a fourth line electrically connecting the two segmental lines of the first line to the third line.

Meanwhile, although the signal line to which each of various embodiments is applied may be the start signal line disposed between the gate driving circuit and the active area, embodiments of the present disclosure are not limited thereto, but may be applied to at least one of all signal lines elongated for transferring a signal to a driving circuit on an array substrate with GIP structure, for example the VDD line, the VSS line, the CLK line and the like.

Hereafter, each of three embodiments will be described in detail in reference with the accompanying drawings.

Figure 4:
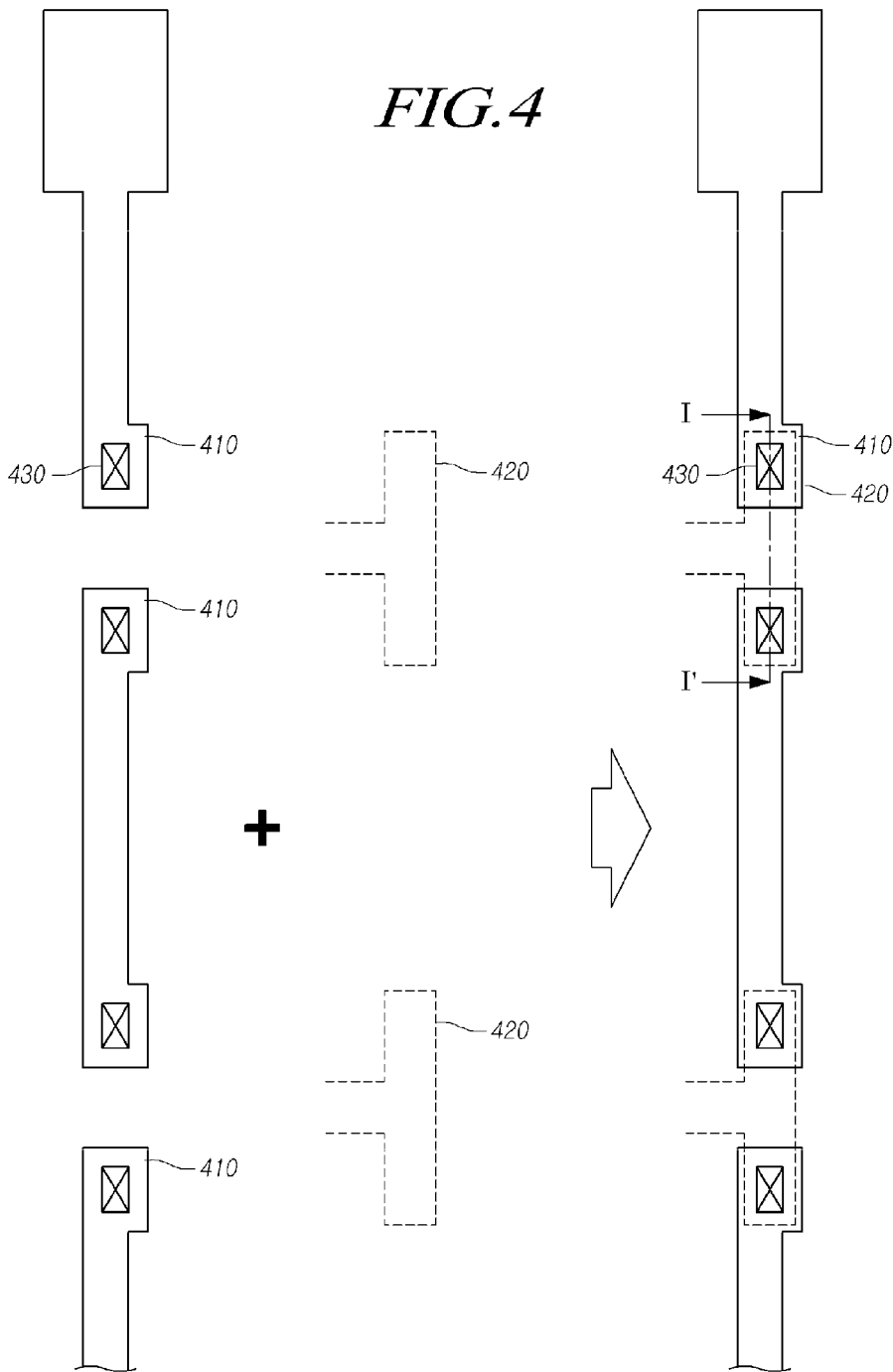
FIG. 4 is a top plan view of a part of a signal line on an array substrate according to a first embodiment.
Figure 5:
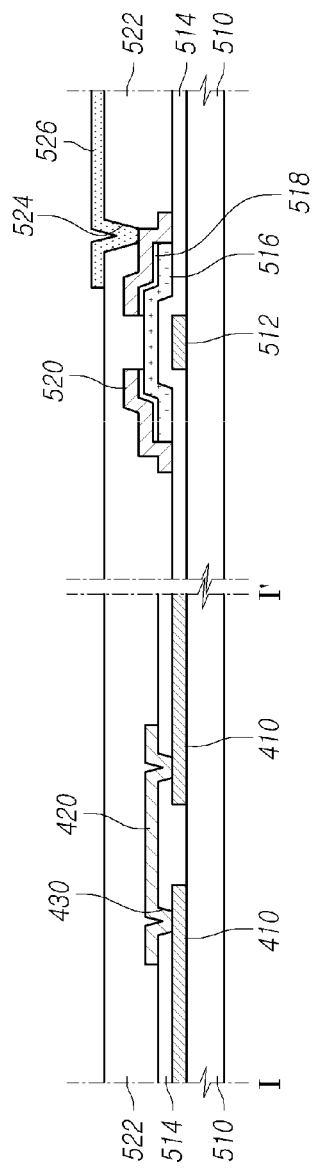
FIG. 5 is a cross-sectional view of a part of a signal line on an array substrate according to a first embodiment.
Figure 6A:
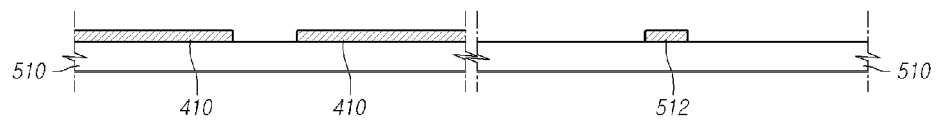
FIGS. 6A through 6C are cross-sectional views showing manufacturing processes of the array substrate according to the first embodiment.
Figure 6B:
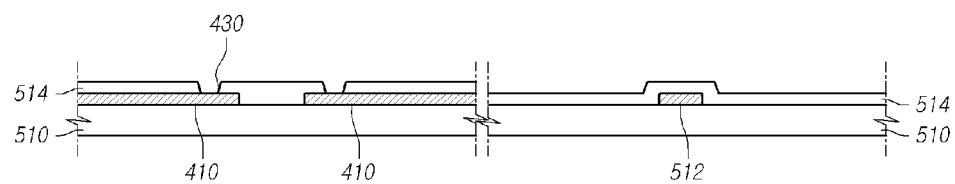
Figure 6C:
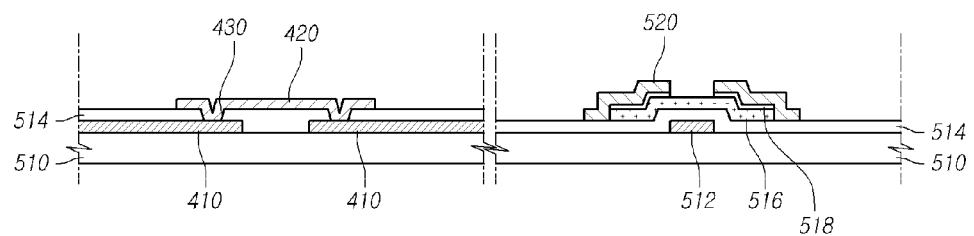

FIGS. 4, 5 and 6A through 6C illustrate the configuration of the first embodiment. FIG. 4 is a top plan view of a part of a signal line on the array substrate according to the first embodiment. FIG. 5 is a cross-sectional view of a part of a signal line on the array substrate according to the first embodiment. FIGS. 6A through 6C are cross-sectional views showing manufacturing processes of the array substrate according to the first embodiment.

The first embodiment relates to the signal line, specifically forward/backward start signal line, extending in parallel with the data line in the non-active area to transfer a signal to the gate driving circuit. As shown in FIG. 4, such signal line may include a first line 410 with a plurality of segmental lines and a second line 420 as a connecting line. The first line 410 is formed of the gate metal layer and is segmented into a plurality of segmental lines extending in the longitudinal direction of the panel or the array substrate in order to be disconnected from each other (in other words, a gap may be formed in each case between two neighboring segmental lines). The second line 420 may be formed of a source/drain metal at the different layer from the first line 410 and electrically connect ends of two segmental lines of the first line 410 adjacent to each other.

The first line 410 and the second line 420 may be connected to each other via a first contact hole 430 which is formed through the gate insulating layer on the top portion of the first line 410 to expose a part of the first line 410.

The total number of the segmental lines of the first line 410 extended over the entire panel in the longitudinal direction of the panel, namely the direction of the data lines, may be from at least two to dozens, but it is net limited thereto.

FIG. 5 illustrates a cross-sectional view of a part of a signal line taken along I-I' line on the array substrate on a left side, and a thin film transistor on a right side, according to the first embodiment.

As shown in left side of the cross-sectional view taken along I-I' line in FIG. 5, the signal line according to the first embodiment may include the first line 410 with a plurality of segmental lines, the first contact hole 430 and the second line 420. The first line 410 with the plurality of segmental lines is formed of the same metal and process as the gate electrode 512 of the thin film transistor. The first contact hole 430 is formed through the gate insulating layer 514 on the top portion of the first line 410 to expose a part of the first line 410. The second line may be formed of the same metal and process as the source/drain electrode 520 of the thin film transistor and electrically connect two segmental lines of the first line adjacent to each other via the first contact hole 430.

Each layer of the thin film transistor shown in the right side of FIG. 5 is illustrated to understand the material and the process for forming the signal line according to the embodiment. In FIGS. 5, 522, 524 and 526 indicate respectively a passivation a contact hole for a pixel electrode and the pixel electrode.

A manufacturing method of this array substrate and the configuration of each layer such as the material and the process of the thin film transistor is explained with reference to FIGS. 6A to 6C.

FIGS. 6A to 6C are cross-sectional views showing a manufacturing process of the array substrate according to the first embodiment.

Referring to FIG. 6A, a first metal layer is formed on a transparent insulation substrate such as a glass or a plastic substrate by depositing a metallic material or a metal alloy for the gate of relatively low specific resistance such as one or more of Al, AlNd, Cu, Mo, MoTi and the like on the entire surface of the substrate and patterning by mask and lithography processes including coating a photoresist, exposing the photoresist to light, developing the exposed photoresist, etching a part of the first metal layer, stripping the photoresist and the like. The first line 410 with the plurality of segmental lines extending in the longitudinal direction of the panel is formed by patterning the gate metal layer. The first line may be either in a monolayer or a multilayer.

The gate line (not shown) connected to each pixel area and the gate electrode 512 of the driving TFT or the pixel TFT is together formed by the above mentioned process. For example, the gate line and gate electrode 512 may be formed simultaneously with the first line 410 by patterning the first metal layer.

Referring to FIG. 6B, after there is placed a first mask having a transparent area TA corresponding to an area except for the data driving circuit DCA on the substrate on which the gate line, the gate electrode 512 and the first line 410 with the plurality of segmental lines are formed, a first insulating material, for example any one of silicon nitride ($SiN_x$) or silicon oxide ($SiO_2$), is deposited on the substrate, thereby forming the gate insulating layer 514 at an area except for the data driving circuit DCA.

Although the gate insulating layer 514 is described as a monolayer, it may be formed of a multilayer with two or more layers consisting of the different materials from each other.

After the gate insulating layer 514 is formed, the first contact hole 430 exposing an end of the first line 410 is formed by etching a part of the gate insulating layer 514 through the above mentioned mask and lithography process.

As shown in FIG. 6B, the mask process used for forming the first contact hole 430 on the gate insulating layer 514 may be further added to the general mask processes of manufacturing the display panel.

A zinc oxide based material as an oxide semiconductor material, for example IGZO (Indium Gallium Zinc Oxide), ZTO (Zinc Tin Oxide), ZIO (Zinc Indium Oxide), is deposited or coated on the gate insulating layer 514 to form an oxide semiconductor layer and then the oxide semiconductor layer is patterned by performing a mask process, thereby forming an active layer or semiconductor layer 516 of an island type on the gate electrode 512 of each TFT.

Such semiconductor layer 516 is not limited to the above mentioned oxide semiconductor material, but may also be formed of polycrystalline silicon (poly-Si), pure or impurity-amorphous silicon (a-Si) and the like.

To form the semiconductor layer 516 using the poly-Si, an amorphous silicon layer is typically formed on a substrate 510 and crystallized to form a polycrystalline silicon layer which is then patterned. The amorphous silicon layer may be formed by a chemical vapor deposition method or a physical vapor deposition method. When (or after) the amorphous silicon layer is formed, it may be dehydrogenated to reduce hydrogen concentration. One of solid phase crystallization (SPC), rapid thermal annealing (RTA), metal induced crystallization (MIC), metal induced lateral crystallization (MILC), a super grain silicon (SGS) process, excimer laser annealing (ELA), and sequential lateral solidification (SLS) may be used to crystallize the amorphous silicon layer.

Next, an ohmic contact layer 518 is formed on the semiconductor layer 516 and a source/drain electrode 520 is formed thereon. During the forming process of the source/drain electrode 520, there is simultaneously formed the second line 420, which electrically connects two first segmental lines of the first line 410 adjacent to each other via the first contact hole 430 previously formed in the signal line area.

In more detail, after the semiconductor layer 516 and/or the ohmic contact layer 518 is formed, a second metal layer is formed on the substrate by depositing a metallic material or a metal alloy for the source/drain such as one or more of Cu, Cr, Al, AlNd, Ti, Ta, Mo, MoTi, Mo alloy and the like on the entire surface of the substrate. The second line 420 is formed in the signal line area by patterning the second metal layer by performing a mask and lithography process.

The data line (not shown) connected to each pixel area and the source/drain electrode 520 of the driving TFT or the pixel TFT is together formed by the above mentioned process. For example, the data line and the source/drain electrode 520 may be formed simultaneously with the second line 420 by patterning the second metal layer.

An etch stopper in an island shape consisting of an inorganic insulating material may be formed instead of or in addition to the ohmic contact layer 518 and the source/drain electrode in contact with the top surface of both ends of the semiconductor layer by patterning the source/drain metal layer.

The patterning process of the semiconductor layer and source/drain may use one of a half-tone mask, a slit mask and the like having semitransparent property at some area, which forms a photoresist layer having three kinds of thickness as a single mask so as to perform the patterning of two layers by only a single mask.

Although not shown, after the source/drain patterning is formed, a contact hole may be formed by forming a passivation layer and then removing a part of the passivation layer on the drain electrode, and a pixel electrode may be formed to be connected to the drain electrode via the contact hole. At this time the pixel electrode may be a transparent electrode. Material for the transparent, electrode may be a metal oxide such as ITO (Indium Tin. Oxide), IZO ($In_2O_3ZnO$) and IZTO ($In_2O_3ZnOSnO$), or a combination of metal and oxide (e.g. an oxide doped with a metal) such as ZnO:Al or $SnO_2$:Sb, but it is not limited thereto.

The signal line is not formed of a single line extended over the entire panel in the longitudinal direction of the panel but the plurality of segmental lines with the gate metal when the array substrate is manufactured in FIGS. 6A through 6C. Since the following processes proceed in this state, the plurality of segmental lines continue to be disconnected until the end of the source/drain metal patterning process as shown in FIG. 6C. Therefore although static electricity is generated from the equipment in the following processes, the segmental lines being disconnected may not conduct the static electricity, thereby preventing the damage from the above mentioned static electricity in various patterning processes.

The first embodiment in FIGS. 4, 5 and 6A through 6C has the effect that the electrical conductivity of the signal line is excellent since the whole signal line comprises a plurality of segmental lines of the first line 410 and the second line 420 as a connection line made of low-resistance metal, wherein one additional mask process may be used in order to form the first contact hole 430 on the gate insulating layer 514.

The above embodiment is not limited to the structure of the thin film transistor as shown in FIGS. 4, 5 and 6A through 6C. If the Signal line includes the first line with the plurality of segmental lines and the second line at the different layer from the first line which electrically connects the segmental lines, the above embodiment may be applied to the array substrate on which any structure of the thin film transistor is formed.

Figure 7:
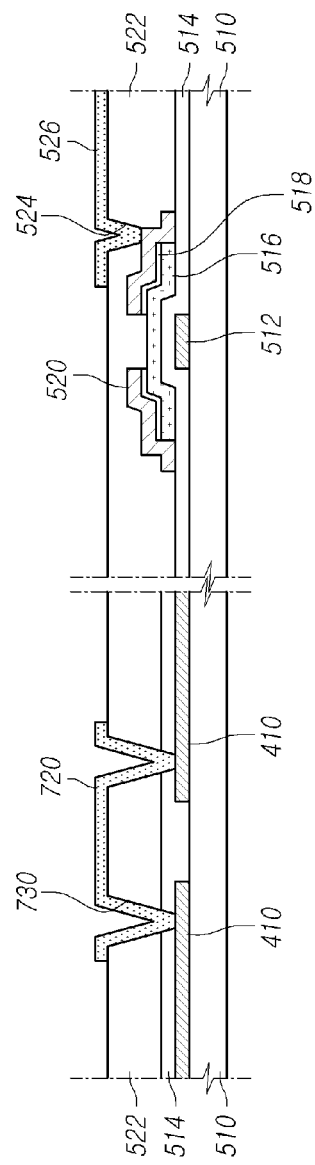
FIG. 7 is a cross-sectional view of a part of a signal line on an array substrate according to a second embodiment.

FIGS. 7 and 8A through 8D illustrate the configuration of the second embodiment. FIG. 7 is a cross-sectional view of a part of a signal line on the array substrate according to the second embodiment. FIGS. 8A through 8D are cross-sectional views showing manufacturing processes of the array substrate according to the second embodiment.

The second embodiment is similar to the first embodiment. While the second line 420 of FIGS. 4, 5, 6A through 6C is formed of the source/drain pattern in the first embodiment, the second line 720 is formed of a pixel electrode material in the second embodiment. The second embodiment is also different from the first embodiment in that a second contact hole 730 for connecting the second line and the first line is formed through a gate insulating layer 514 and a passivation layer 522.

FIG. 7 illustrates a cross-sectional view of a signal line of the array substrate on a left side, and a thin film transistor on a right side, according to the second embodiment.

In more detail, the second embodiment relates to the signal line, specifically forward/backward start signal line, extending in parallel with the data line in the non-active area of the array substrate with GIP structure. As shown in FIG. 7, such signal line may include a first line 410 with a plurality of segmental lines and a second line 720 as a connecting line. The first line 410 is formed of the gate metal layer and is segmented into a plurality of segmental lines extending in the longitudinal direction of the panel or the array substrate in order to be disconnected (in other words, a gap may be formed in each case between two neighboring segmental lines). The second line 720 may be formed of a pixel electrode metal at the different layer from the first line 410, and electrically connects ends of two segmental lines of the first line 410 adjacent to each other. The gate insulating layer 514 and a passivation layer 522 may be formed between the layers of the first line 410 and second line 720.

The second line 720 may be connected with the first line 410 via a second contact hole 730 which is formed through the gate insulating layer 514 and the passivation layer 522 on the top portion of the first line 410 to expose a part of the first line 410.

Each layer of the thin film transistor shown in the right side of FIG. 7 is illustrated to understand the material and the process for forming the signal line of the array substrate according to the second embodiment.

FIGS. 8A to 8D are cross-sectional views showing manufacturing processes of the array substrate according to the second embodiment.

The manufacturing processes of the array substrate according to the second embodiment are similar to some of manufacturing processes of the array substrate according to the first embodiment, therefore detailed description of these manufacturing processes are omitted for the sake of brevity.

Figure 8A:
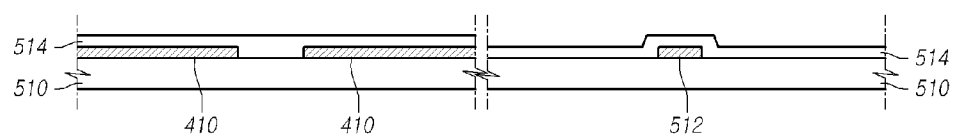
FIGS. 8A to 8D are cross-sectional views showing manufacturing processes of the array substrate according to the second embodiment.

Referring to FIG. 8A, the first metal layer is formed on a transparent insulation substrate such as a glass or a plastic substrate by depositing a metallic material or a metal alloy for the gate of relatively low specific resistance such as one or more of Al, AlNd, Cu, Mo, MoTi and the like on the entire surface of the substrate. The gate line (not shown) connected to each pixel area and the gate electrode 512 of the driving TFT or the pixel TFT are simultaneously formed by the above mentioned process.

A first insulating layer is formed of an inorganic insulating material, and is formed on the substrate on which (i) the gate line, (ii) the gate electrode 512 and (iii) the first line 410 with the plurality of segmental lines are formed.

Next, the semiconductor layer 516, an ohmic contact layer 518 and a source/drain electrode 520 for a thin film transistor in the pixel area and the driving circuit area are sequentially formed. These processes are described in the first embodiment in FIG. 6 so that the duplicate description is omitted.

Figure 8B:
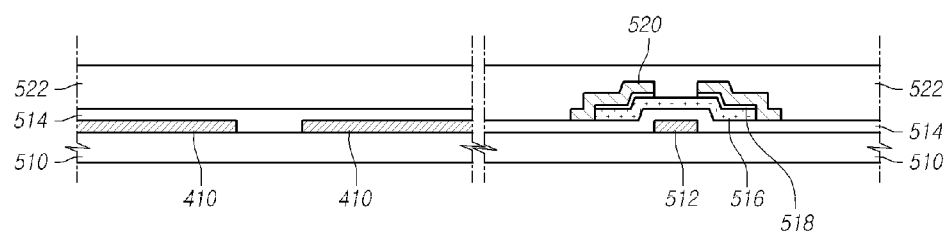

Referring to FIG. 8B, after the forming process of the source/drain electrode 520, the passivation layer 522 is formed thereon.

Figure 8C:
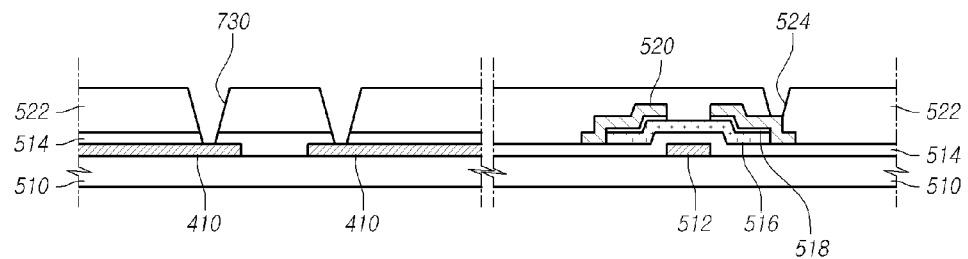

Referring to FIG. 8C, a drain contact hole through the passivation layer 522 may be formed to expose a part of the drain electrode of the thin film transistor to connect the pixel electrode. During the forming process of the drain contact hole, the second contact hole 730 exposing an end of the first line 410 is formed by etching a part of the gate insulating layer 514 and the passivation layer 522 through the mask and lithography processes.

Figure 8D:
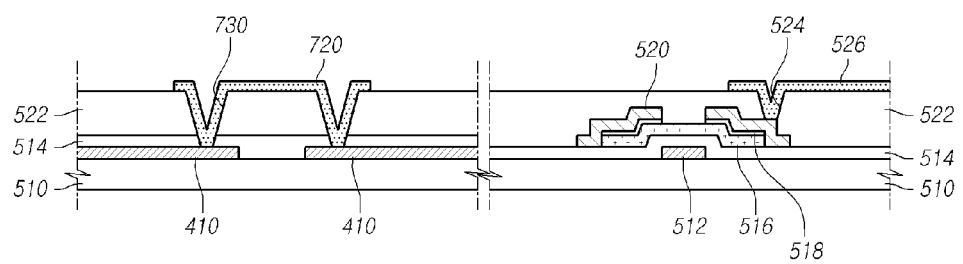

Referring to FIG. 8D, during the forming process of the pixel electrode, the second line 720 is formed which connects the segmental lines adjacent to each other via the second contact hole 730. The second line 720 is formed of the same material as the pixel electrode 526. The second line 720 may be made of a transparent conducting material with relatively large work function such as a metal oxide such as ITO (Indium Tin Oxide), IZO ($In_2O_3ZnO$) and IZTO ($In_2O_3ZnOSnO$), or a combination of metal and oxide (e.g. an oxide doped with a metal) such as ZnO:Ai or $SnO_2$:Sb, but it is not limited thereto.

Compared to the first embodiment in FIGS. 4, 5 and 6A through 6C, in the second embodiment the material and the layer of the second line 720 to connect the segmental lines of the first line 410 as a jumper are different from that of the first line 410. In the second embodiment, the second contact hole 730 and the second line 720 are simultaneously formed by the process for forming the contact hole 524 and the pixel electrode 526 in the pixel area, without the additional mask process necessary for forming the first contact hole 430 through the gate insulating layer 514 as in the first embodiment. While the second line 420 as the jump-connecting line in the first embodiment is formed of the source/drain metal with the excellent electrical conductivity, the second line 720 in the second embodiment is formed of the transparent conducting material such as the pixel electrode material so that they may have the different conductive properties from each other.

The signal line is not formed of a single line extended over the entire panel in the longitudinal direction of the panel but is formed of the plurality of segmental lines with the gate metal when the array substrate is manufactured as in FIG. 8A. Because the following processes proceed, in this state, the plurality of segmental lines remain disconnected (in other words, gaps remain between neighboring segmental lines; in still other words, neighboring segmental lines are not electrically connected to one another) until the end of the pixel electrode forming process as shown in FIG. 8D. Therefore, although the static electricity is generated from the equipment in the following processes, due to the segmental lines being disconnected the static electricity is not conducted, thereby preventing the damage from the above mentioned static electricity in various patterning processes.

Figure 9:
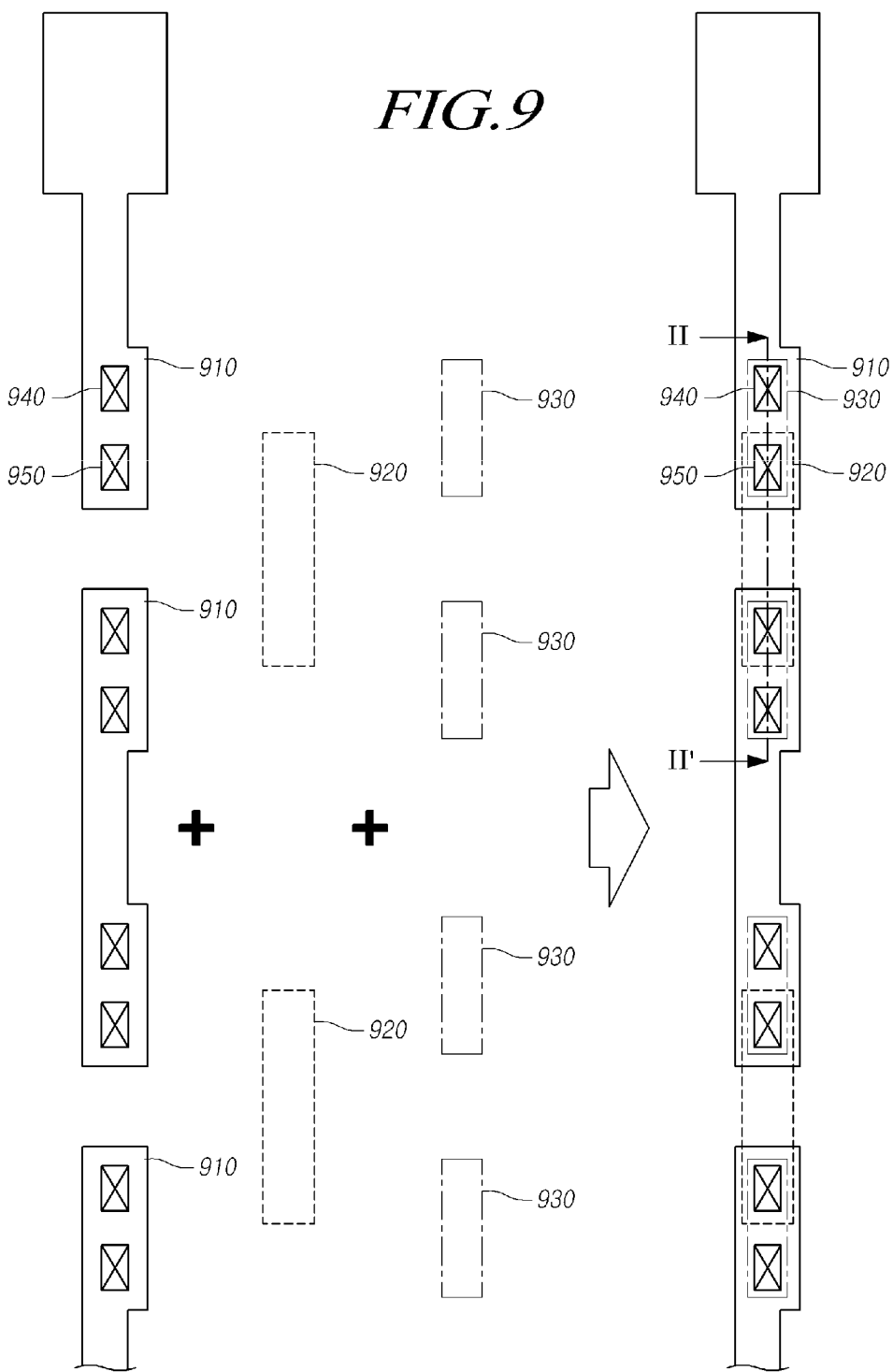
FIG. 9 is a top plan view of a part of a signal line on an array substrate according to a third embodiment.
Figure 10:
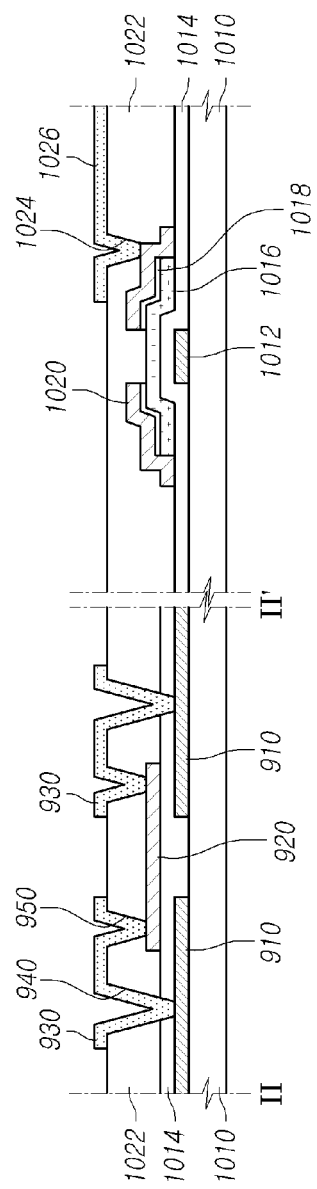
FIG. 10 is a cross-sectional view of a part of a signal line on an array substrate according to a third embodiment.

FIGS. 9, 10, and 11A through 11D illustrate the configuration of the third embodiment. FIG. 9 is a top plan view of a part of a signal line on the array substrate according to the third embodiment. FIG. 10 is a cross-sectional view of a part of a signal line on the array substrate according to the third embodiment. FIGS. 11A through 11D are cross-sectional views showing a manufacturing process of the array substrate according to the third embodiment.

The third embodiment relates to the Signal line, specifically forward/backward start signal line, extending in parallel with the data line in the non-active area to transfer a signal to the gate driving circuit. As shown in FIG. 9, such signal line may include a first line 910 with a plurality of segmental lines, a third line 920 and a fourth line 930. The first line 910 is formed of the gate metal layer and is segmented into a plurality of segmental lines extending in the longitudinal direction of the panel or the array substrate in order to be disconnected. The third line 920 may be formed of a source/drain metal at a different layer than the first line 910 and partially overlapped with two segmental lines of the first line 910. The fourth line 930 is formed of a different material and formed at a different layer than the first line 910 and the third line 920 and electrically connects the two segmental lines of the first line 910 to the third line 920. In the third embodiment, the first line 910 is formed of a gate metal and the third line 920 is formed of a source/drain metal, and the fourth line 930 is formed of a pixel electrode material. The fourth line 930 is also connected to both the first line 910 and the third line 920 via a third contact hole 940 formed through a gate insulating layer and a passivation layer to expose a part of the first line 910 and a fourth contact hole 950 formed through the passivation layer to expose a part of the third line 920.

In the second embodiment the third line 920 of the source/drain metal layer is formed at a different layer than the first line 910 and they are connected with each other through the fourth line 930.

FIG. 10 illustrates a cross-sectional view of a part of a signal line taken along II-II' line of FIG. 9 on the array substrate on a left side, and a thin film transistor on a right side, according to the third embodiment.

As shown on the left side of FIG. 10, the signal line according to the third embodiment may include the first line 910 with a plurality of segmental lines, a third line 920 as a connecting line and a fourth line 930. The first line 910 with the plurality of segmental lines is formed of the same metal and process as the gate electrode 1012 of the thin film transistor. The third line 920 may be formed of the same metal and process as the source/drain electrode 1020 of the thin film transistor and disposed between two segmental lines of the first line 910 adjacent to each other. The forth line 930 is formed of a different material and at a different layer than the first line 910, namely the pixel electrode layer, and the third line 920 and electrically connects the two segmental lines of the first line 910 to the third line 920.

The fourth line 930 also connects both the first line 910 and the third line 920 via a third contact hole 940 formed through the gate insulating layer 1014 and the passivation layer 1022 coated on the first line 910 to expose a part of the first line 910, and via a fourth contact hole 950 formed through a part of the passivation layer 1022 on the third line 920 to expose a part of the third line 920. Pixel electrode 1026 may be electrically connected to drain electrode 1020 through contact hole 1024.

FIGS. 11A through 11D are cross-sectional views showing manufacturing processes of the array substrate according to the third embodiment.

Figure 11A:
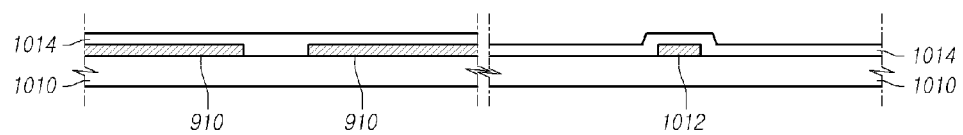
FIGS. 11A through 11D are cross-sectional views showing a manufacturing process of the array substrate according to the third embodiment.

Referring to FIG. 11A, the first metal layer is formed on a transparent insulation substrate 1010 such as a glass or a plastic substrate by depositing a metallic material or a metal alloy for the gate of relatively low specific resistance such as one or more of Al, AlNd, Cu, Mo, MoTi and the like on the entire surface of the substrate.

The gate line (not shown) connected to each pixel area and the gate electrode 1012 of the driving TFT or the pixel TFT are simultaneously formed by the above mentioned process.

A first insulating layer 1014 is formed of an insulating material on the substrate on which the gate line, the gate electrode 1012 and the first line 910 with the plurality of segmental lines are formed.

Figure 11B:
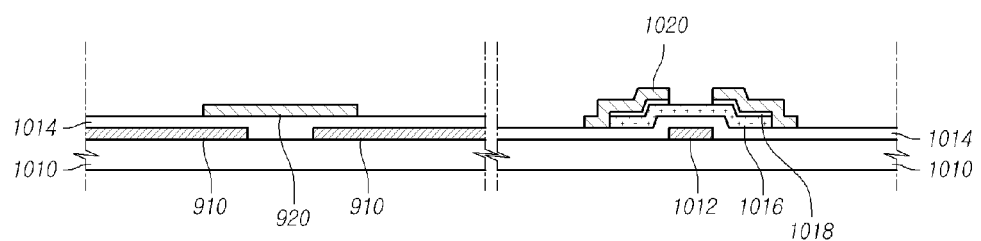

Referring to FIG. 11B, the semiconductor layer 1016 is formed in a thin film transistor area on the gate insulating layer 1014 in the shape of an island and an ohmic contact layer 1018 is formed on the semiconductor layer 1016, and during a source/drain electrode 1020 is formed thereon, the third line 920 is formed of a source/drain metal between the segmental lines of the first line 910 in the signal line area.

In this time the third line 920 may be formed to be partially overlapped with two segmental lines of the first line 910. For example, a part of the third line 920 is formed above a part of a segmental line of the first line 910, and another part of the third line 920 is formed above a part of another segmental line of the first line 910.

The forming process of the semiconductor layer 1016 and an ohmic contact layer 1018, and an etch stopper instead of the ohmic contact layer 1018 correspond to those of the first embodiment, therefore the detailed description thereof is omitted herein for the sake of brevity.

Figure 11C:
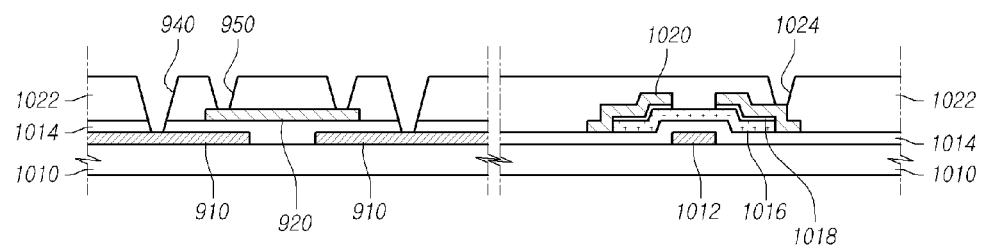

Referring to FIG. 11C, the passivation layer 1022 is coated on an entire surface of the substrate on which the source/drain electrode 1020 is formed in the thin film transistor area and the third line 920 in the signal line area, and a drain contact hole through the passivation layer 1022 may be formed to expose a part of the drain electrode of the thin film transistor to connect the pixel electrode. During the forming process of the drain contact hole, the third contact hole 940 exposing an end of the first line 910 is formed by etching a part of the gate insulating layer 1014 and the passivation layer 1022 at ends of the first line 910 through the mask and lithography processes. The fourth contact hole 950 is simultaneously formed by etching a part of the passivation layer 1022 on the first line 910.

Figure 11D:
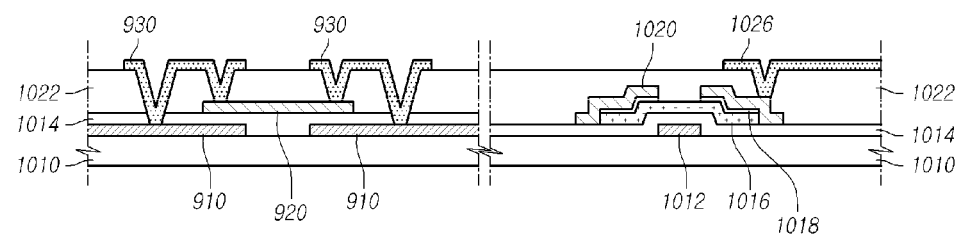

Referring to FIG. 11D, during the forming process of the pixel electrode 1026, there is formed the fourth line 930 which connects the segmental lines adjacent to each other via the third and fourth contact holes 940, 950. The fourth line 930 is formed of the same material as the pixel electrode. The fourth line 930 may be made of a transparent conducting material with relatively large work function such as a metal oxide such as ITO (Indium Tin Oxide), IZO ($In_2O_3ZnO$) and IZTO ($In_2O_3ZnOSnO$), a combination of metal and oxide (e.g. an oxide doped with a metal) such as ZnO:Al or $SnO_2$:Sb, but it is not limited thereto.

The signal line is not formed of a single line extended over the entire panel in the longitudinal direction of the panel but of the plurality of segmental lines with the gate metal when the array substrate of the third embodiment is manufactured. Since the following processes proceed in this state, the plurality of segmental lines remains disconnected until the end of the pixel electrode forming process as shown in 11D. Therefore although the static electricity is generated from the equipment in the following processes, because the segmental lines are disconnected, the static electricity is not conducted, thereby preventing the damage from the above mentioned static electricity in various patterning processes.

In the third embodiment, an additional mask process is not necessary for forming the first line, the third line, the fourth line, the third contact hole and the fourth contact hole except for the general mask processes used for the manufacturing method of the conventional array substrate. Namely, the first line with the segmental lines is simultaneously formed in the patterning process of the gate metal layer, the third line is simultaneously formed in the patterning process of the source/drain metal layer, the third and the fourth contact holes are simultaneously formed in the forming process of the contact hole for connecting between the drain electrode and the pixel electrode, and the fourth line is simultaneously formed in the patterning process of the pixel electrode.

The first line as the main signal line and the third line 920 as the jump-connecting line are formed of the gate or the source drain metal with the low resistance in the third embodiment in FIGS. 9, 10 and 11A through 11D. As a result, the conductive property of the entire signal line is excellent. In addition, an additional mask process is not implemented according to the third embodiment, in contrast to the manufacturing method of the conventional array substrate.

As mentioned above, various embodiments may prevent the generation of static electricity from the elongated signal line during manufacturing the display panel with the GIP structure so that they may prevent the large static electricity from destroying the gate metal and the like.

In more detail, in the array substrate with the GIP structure, the signal line elongated from the non-active area to transfer various signals to the driving circuit area is formed to be divided into the first line with the plurality of segmental lines and the second to fourth lines as a jumper. Hence, damage to the substrate due to the generated static electricity in the following patterning processes may be eschewed.

Although various embodiments have been described up to now with reference to the accompanying drawings, the present invention is not limited to them.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. A term ordinarily used like that defined by a dictionary shall be construed that it has a meaning equal to that in the context of a related description, and shall not be construed in an ideal or excessively formal meaning unless it is clearly defined in the present specification.

Although the embodiments of the present invention have been described for illustrative purposes, those skilled in the art will appreciate that various modifications, additions and substitutions are possible, without departing from the scope and spirit of the invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. An array substrate comprising:
    an active area including a plurality of pixels defined at intersection areas of gate lines and data lines;
    a gate driving circuit disposed at one side of a non-active area;
    a first signal line having a length in the non-active area extending in parallel with lengths of the data lines in the active area, the first signal line configured to transfer a high level driving voltage or a low level driving voltage to the gate driving circuit, the first signal line disposed at one side of the gate driving circuit away from the active area; and
    a second signal line having a length in the non-active area extending in parallel with the lengths of the data lines in the active area, the second signal line configured to transfer a forward start signal or a backward start signal to the gate driving circuit, the second signal line including a first line with a plurality of segmental lines, and at least one additional line made of a different material and disposed at a different layer than the first line, the at least one additional line electrically connecting two segmental lines of the first line adjacent to each other, the second signal line disposed between the gate driving circuit and the active area at another side of the gate driving circuit opposite to the one side of the gate driving circuit at which the first signal line is disposed.

2. The array substrate of claim 1, wherein the at least one additional line comprises a second line, wherein the first line is made of a gate metal and the second line is made of a source/drain metal, and the second line is connected with the first line via a contact hole provided through a gate insulating layer.

3. The array substrate of claim 1, wherein the at least one additional line comprises a second line wherein the first line is formed of a gate metal and the second line is formed of a pixel electrode material, and the second line is connected with the first line via a contact hole formed through a gate insulating layer and a passivation layer.

4. The array substrate of claim 1, wherein the at least one additional line comprises a third line formed of a different layer than the first line and partially overlapped with two segmental lines of the first line adjacent to each other, and a fourth line electrically connecting the two segmental lines of the first line to the third line.

5. The array substrate of claim 4,
    wherein the first line is formed of a gate metal and the third line is formed of a source/drain metal, the fourth line is formed of a pixel electrode material, and
    wherein the fourth line is connected to both the first line and the third line via a contact hole formed through a gate insulating layer and a passivation layer to expose a part of the first line and an additional contact hole formed through the passivation layer to expose a part of the third line.

6. The array substrate of claim 2, wherein the second signal line is made of at least one metallic material or a metal alloy selected from a group consisting of Al, AlNd, Cu, Mo and MoTi.

7. The array substrate of claim 2, wherein the gate insulating layer includes a multilayer with two or more layers consisting of different materials from each other.

8. A method of fabricating an array substrate, the method comprising:

forming a first signal line having a length in a non-active area extending in parallel with lengths of data lines in an active area, the active area including a plurality of pixels defined at intersection areas of gate lines and the data lines, the first signal line configured to transfer a high level driving voltage or a low level driving voltage to a gate driving circuit, the gate driving circuit disposed at one side of the non-active area, the first signal line formed at one side of the gate driving circuit away from the active area;

forming a first line with a plurality of segmental lines as a part of a second signal line in the non-active area by patterning a first metal layer on a substrate between the gate driving circuit and the active area at another side of the gate driving circuit opposite to the one side of the gate driving circuit at which the first signal line is disposed, the second signal line configured to transfer a forward start signal or a backward start signal to the gate driving circuit, the second signal line having a length in the non-active area extending in parallel with the lengths of the data lines in the active area;

forming one or more insulating layers on the substrate on which a gate is patterned;

forming at least one contact hole through the one or more insulating layers to expose a part of the first line; and forming at least one additional line of the second signal line by patterning a second metal layer different from the first metal layer to electrically connect two segmental lines of the first line adjacent to each other.

9. The method of claim 8, wherein the first metal layer is a gate metal layer, the one or more insulating layers include a gate insulating layer and the second metal layer is a source/drain metal layer.

10. The method of claim 8,
wherein the first metal layer is a gate metal layer, the one or more insulating layers include a gate insulating layer and a passivation layer, and the second metal layer is a pixel electrode layer.

11. The method of claim 8,
wherein the first metal layer is a gate metal layer, the one or more insulating layers include a gate insulating layer and at least one passivation layer,
wherein forming the one or more insulation layers, the at least one contact hole and the at least one additional line includes:

forming (i) the gate insulating layer on the substrate on which the gate is patterned, and (ii) a third line with a source/drain metal, wherein ends of the third line are partially overlapped with the two segmental lines of the first line adjacent to each other;

forming (i) the passivation layer on the non-active area (NA), (ii) a contact hole penetrating the gate insulating layer and the passivation layer to expose a part of the first line, and (iii) an additional contact hole penetrating the passivation layer to expose a part of the third line; and forming a fourth line electrically connecting the two segmental lines adjacent to each other to the third line through (i) the contact hole penetrating the gate insulating layer and the passivation layer, and (ii) the additional contact hole penetrating the passivation layer during a pixel electrode patterning process.

* * * * *